(12) United States Patent
Su et al.

(10) Patent No.: US 11,725,273 B2
(45) Date of Patent: Aug. 15, 2023

(54) ELECTRONIC DEVICE AND MANUFACTURING METHOD THEREOF

(71) Applicant: Au Optronics Corporation, Hsinchu (TW)

(72) Inventors: Chun-Hao Su, Hsinchu (TW); Chia-Ming Chang, Hsinchu (TW); Chia Wen Dai, Hsinchu (TW); Jiang-Jin You, Hsinchu (TW); Tai-Tso Lin, Hsinchu (TW); Chun-Nan Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 56 days.

(21) Appl. No.: 17/515,568

(22) Filed: Nov. 1, 2021

(65) Prior Publication Data

US 2022/0341032 A1 Oct. 27, 2022

(30) Foreign Application Priority Data

Apr. 26, 2021 (TW) .................................. 110114895

(51) Int. Cl.
*H01L 27/12* (2006.01)
*C23C 14/54* (2006.01)
*C23C 14/34* (2006.01)

(52) U.S. Cl.
CPC ........ *C23C 14/545* (2013.01); *C23C 14/3492* (2013.01); *H01L 27/1244* (2013.01); *Y10T 428/12493* (2015.01)

(58) Field of Classification Search
None
See application file for complete search history.

(56) References Cited

U.S. PATENT DOCUMENTS

| 6,770,383 | B2 | 8/2004 | Tanaka et al. |
| 9,099,396 | B2 | 8/2015 | Wu et al. |
| 9,426,915 | B2 | 8/2016 | Ohashi et al. |
| 9,576,984 | B1 * | 2/2017 | Shih .................. H01L 29/66969 |

(Continued)

FOREIGN PATENT DOCUMENTS

| CN | 1318647 | 5/2007 |
| CN | 107579053 | 1/2018 |

(Continued)

*Primary Examiner* — Seth Dumbris
(74) *Attorney, Agent, or Firm* — JCIPRNET

(57) ABSTRACT

An electronic device and a manufacturing method thereof are provided. The electronic device includes an array substrate, which includes a substrate, a first conductive layer, a first insulating layer, a second conductive layer, and a second insulating layer. The substrate has a substrate surface. The first conductive layer is located on the substrate surface. The first insulating layer is located on the first conductive layer. The second conductive layer is located on the first insulating layer and includes a first sputtering layer, a second sputtering layer, and a third sputtering layer. The second insulating layer is located on the second conductive layer. The second sputtering layer is located between the first and third sputtering layers, and includes a first metal element. The first sputtering layer includes the first metal element and a second metal element. The third sputtering layer includes the first metal element and a third metal element.

7 Claims, 9 Drawing Sheets

(56) References Cited

U.S. PATENT DOCUMENTS

| | | | |
|---|---|---|---|
| 9,950,496 B2 | 4/2018 | Sekine et al. | |
| 9,953,891 B2 | 4/2018 | Wu et al. | |
| 10,032,698 B2 | 7/2018 | Lo et al. | |
| 2003/0085404 A1* | 5/2003 | Kim | H01L 27/124 257/E21.414 |
| 2010/0237348 A1* | 9/2010 | Tseng | H01L 29/41733 257/E29.273 |
| 2013/0113094 A1 | 5/2013 | Wu et al. | |
| 2015/0325539 A1 | 11/2015 | Wu et al. | |
| 2017/0271242 A1 | 9/2017 | Lo et al. | |
| 2018/0261631 A1* | 9/2018 | Oda | G02F 1/136259 |

FOREIGN PATENT DOCUMENTS

| | | |
|---|---|---|
| CN | 104885207 | 5/2018 |
| TW | 201320209 | 5/2013 |
| TW | 201614792 | 4/2016 |
| TW | 201841260 | 11/2018 |

* cited by examiner

ELECTRONIC DEVICE AND MANUFACTURING METHOD THEREOF

CROSS-REFERENCE TO RELATED APPLICATION

This application claims the priority benefit of Taiwan application Ser. No. 110114895, filed on Apr. 26, 2021. The entirety of the above-mentioned patent application is hereby incorporated by reference herein and made a part of this specification.

BACKGROUND

Technical Field

The disclosure relates to a device and a manufacturing method thereof, and more particularly to an electronic device and a manufacturing method thereof.

Description of Related Art

Generally speaking, a connection pad of a display panel is made of double-layer or multi-layer metal stacking. In order to reduce the peeling of metal layers from an insulating layer between two adjacent metal layers, a molybdenum (Mo) layer is usually disposed between the two adjacent metal layers to strengthen the adhesive force. However, when the connection pad is connected to a conductive terminal of an electronic element, the bonding strength may be poor, which affects the yield.

SUMMARY

The disclosure provides an electronic device, which can have a better yield.

The disclosure provides a manufacturing method of an electronic device, which can improve the bonding strength and improve the yield of the electronic device.

The electronic device of the disclosure includes an array substrate. The array substrate includes a substrate, a first conductive layer, a first insulating layer, a second conductive layer, and a second insulating layer. The substrate has a substrate surface. The first conductive layer is located on the substrate surface. The first insulating layer is located on the first conductive layer. The second conductive layer is located on the first insulating layer and includes a first sputtering layer, a second sputtering layer, and a third sputtering layer. The second insulating layer is located on the second conductive layer. The second sputtering layer is located between the first sputtering layer and the third sputtering layer. The second sputtering layer includes a first metal element, the first sputtering layer includes the first metal element and a second metal element, and the third sputtering layer includes the first metal element and a third metal element.

The manufacturing method of the electronic device of the disclosure includes the following steps. An array substrate is provided. The array substrate includes a substrate, a first conductive layer, a first insulating layer, a second conductive layer, and a second insulating layer. The substrate has a substrate surface. The first conductive layer is located on the substrate surface. The first insulating layer is located on the first conductive layer. The second conductive layer is located on the first insulating layer and includes a first sputtering layer, a second sputtering layer, and a third sputtering layer. The second insulating layer is located on the second conductive layer. The second sputtering layer is located between the first sputtering layer and the third sputtering layer. The second sputtering layer includes a first metal element, the first sputtering layer includes the first metal element and a second metal element, and the third sputtering layer includes the first metal element and a third metal element. An electronic element is provided. The electronic element includes an element body and a conductive terminal configured on the element body. At least the array substrate and the electronic element are made to be in contact, so that at least part of the second conductive layer in the array substrate and a part of the conductive terminal in the electronic element form a conductive connection structure.

Based on the above, the electronic device of the disclosure has the array substrate. The second conductive layer of the array substrate includes the first sputtering layer, the second sputtering layer, and the third sputtering layer. Since the first sputtering layer directly contacts the first insulating layer, and the first sputtering layer includes the first metal element and the second metal element, the adhesive force between the second conductive layer and the insulating layer can be strengthened to prevent the second conductive layer from peeling from the insulating layer, so as to have a better yield. Since the third sputtering layer is located on the second sputtering layer, the second sputtering layer is protected by the third sputtering layer, which can solve the issue of easy oxidation on the surface of the second sputtering layer. In addition, in the manufacturing method of the electronic device of the disclosure, the conductive connection structure formed by the array substrate and the electronic element being in contact can have a good bonding strength, so that the yield of the electronic device is improved.

DETAILED DESCRIPTION OF DISCLOSED EMBODIMENTS

Figure 1A:
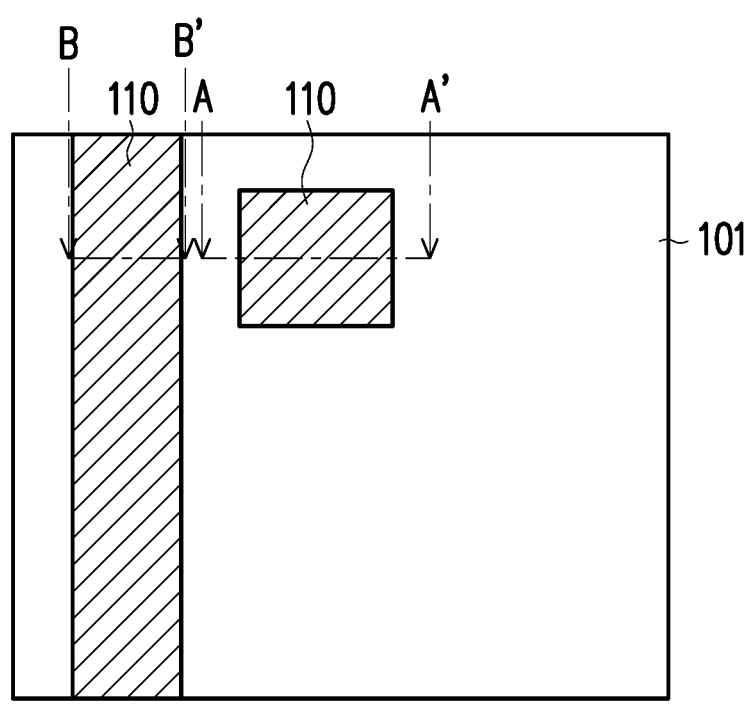
FIG. 1A to FIG. 4D are partial schematic views of part of a manufacturing process of an electronic device according to a first embodiment of the disclosure.

In the drawings, the thickness of layers, films, panels, regions, etc., is exaggerated for clarity. Throughout the specification, the same reference numerals represent the same elements. It should be understood that when an element such as a layer, a film, a region, or a substrate is referred to as being "on" another element or "connected to" another element, the element may be directly on the another element or connected to the another element, or there may be an intermediate element. In contrast, when an element is referred to as being "directly on" another element or "directly connected to" another element, there is no intermediate element. As used herein, "connection" may refer to physical and/or electrical connection. Furthermore, "electrical connection" or "coupling" may be that there is another element between two elements.

It should be understood that although terms such as "first" and "second" may be used herein to describe various elements, components, regions, layers, and/or parts, the elements, components, regions, and/or parts are not limited by the terms. The terms are only used to distinguish one element, component, region, layer, or part from another element, component, region, layer, or part. Therefore, a "first element", "component", "region", "layer", or "part" discussed below may be referred to as a second element, component, region, layer, or part without departing from the teachings herein.

The terminology used herein is only for the objective of describing specific embodiments and is not limiting. As used herein, unless the content clearly indicates otherwise, the singular forms "a", "one", and "the" are intended to include plural forms, including "at least one". "Or" represents "and/or". As used herein, the term "and/or" includes any and all combinations of one or more of the relevant listed items. It should also be understood that when used in the specification, the terms "including" and/or "comprising" designate the presence of the feature, region, entirety, step, operation, element, and/or component, but do not exclude the presence or addition of one or more other features, regions, entireties, steps, operations, elements, components, and/or combinations thereof.

In addition, relative terms such as "lower" or "bottom" and "upper" or "top" may be used herein to describe the relationship between an element and another element, as shown in the drawings. It should be understood that relative terms are intended to include different orientations of a device in addition to the orientation shown in the drawings. For example, if the device in a drawing is flipped, an element described as being on the "lower" side of other elements will be oriented on the "upper" side of the other elements. Therefore, the exemplary term "lower" may include the orientations of "lower" and "upper", depending on the specific orientation of the drawing. Similarly, if the device in a drawing is flipped, an element described as being "below" or "beneath" other elements will be oriented "above" the other elements. Therefore, the exemplary term "below" or "beneath" may include the orientations of above and below.

Unless otherwise defined, all terms (including technical and scientific terms) used herein have the same meaning as commonly understood by persons skilled in the art of the disclosure. It will be further understood that terms such as those defined in commonly used dictionaries should be interpreted as having meanings consistent with the meanings in the related art and the context of the disclosure, and will not be interpreted as having idealized or overly formal meanings unless explicitly defined herein.

The exemplary embodiments are described herein with reference to cross-sectional views that are schematic views of idealized embodiments. Therefore, changes in shapes of illustration as a result of, for example, manufacturing technology and/or tolerances may be expected. Therefore, the embodiments described herein should not be interpreted as being limited to the specific shapes of the regions as shown herein, but include, for example, shape deviations caused by manufacturing. For example, a region that is shown or described as flat may generally have a rough and/or non-linear feature. In addition, an acute angle shown may be rounded. Therefore, the regions shown in the drawings are schematic in nature, and the shapes thereof are not intended to show the precise shapes of the regions and are not intended to limit the scope of the claims.

FIG. 1A to FIG. 4D are partial schematic views of part of a manufacturing process of an electronic device according to a first embodiment of the disclosure. FIG. 1A, FIG. 2A, FIG. 3A, and FIG. 4A are partial top schematic views of part of the manufacturing process of the electronic device according to the first embodiment of the disclosure, and FIG. 1B to FIG. 1D, FIG. 2B to FIG. 2D, and FIG. 3B to FIG. 3D are partial cross-sectional schematic views of part of the manufacturing process of the electronic device according to the first embodiment of the disclosure. FIG. 1B, FIG. 2B, FIG. 3B, and FIG. 4B may respectively correspond to positions of section lines A-A' of FIG. 1A, FIG. 2A, FIG. 3A, and FIG. 4A. FIG. 1C, FIG. 2C, FIG. 3C, and FIG. 4C may respectively correspond to positions of section lines B-B' of FIG. 1A, FIG. 2A, FIG. 3A, and FIG. 4A. FIG. 1D, FIG. 2D, FIG. 3D, and FIG. 4D may respectively correspond to cross-sectional positions of other regions not shown in FIG. 1A, FIG. 2A, FIG. 3A, and FIG. 4A.

Figure 1B:
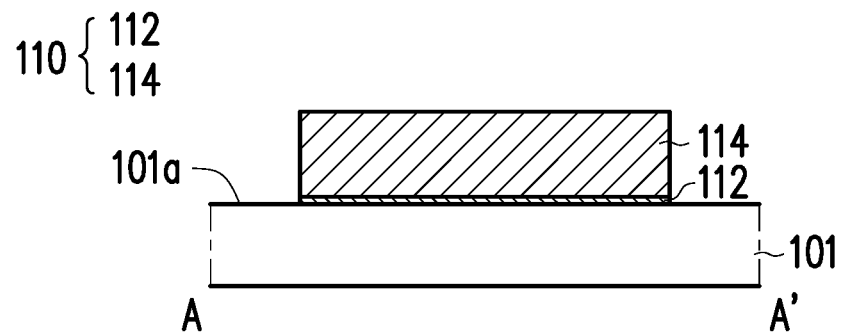
Figure 1C:
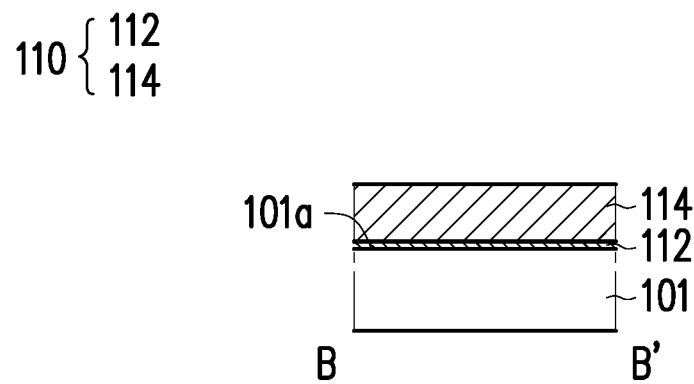
Figure 1D:
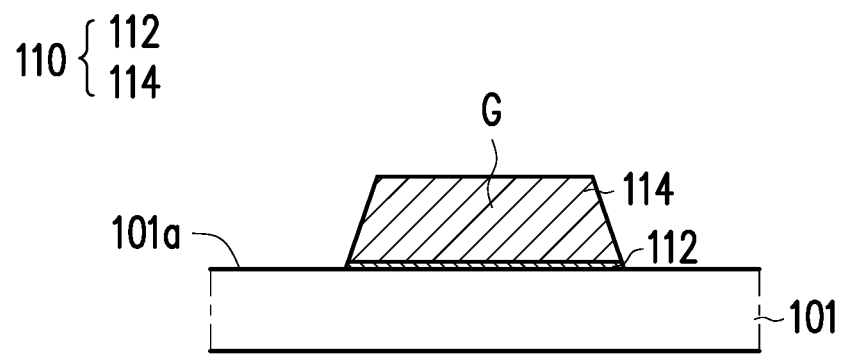

Please refer to FIG. 1A to FIG. 1D. A substrate 101 is provided. The material of the substrate 101 may include glass, plastic, composite material, or other suitable materials, but the disclosure is not limited thereto. The substrate 101 has a substrate surface 101a. The substrate surface 101a may include an active area and an inactive area. An active element may be formed or configured in the active area, and the active element is away from the inactive area. The active element is, for example, a thin film transistor, but the disclosure is not limited thereto. Taking the embodiment as an example, FIG. 1B and FIG. 1C are within a range corresponding to the inactive area, and FIG. 1D is within a range corresponding to the active area.

In an embodiment, a suitable film layer (for example, an insulating layer referred to as a buffer layer) may be provided on the substrate surface 101a of the substrate 101, but the disclosure is not limited thereto.

Please continue to refer to FIG. 1A to FIG. 1D. A first conductive layer 110 is formed on the substrate surface 101a. The first conductive layer 110 may include a first sputtering layer 112 and a second sputtering layer 114. The first sputtering layer 112 is located between the substrate 101 and the second sputtering layer 114. The first sputtering layer 112 includes a first metal element and a second metal element (for example, an alloy including the first metal element and the second metal element). The second sputtering layer 114 includes the first metal element but does not include the second metal element. The second metal element is different from the first metal element. The first metal element is, for example, copper, but the disclosure is not limited thereto. The second metal element is, for example, nickel, iron, indium, antimony, bismuth, silver, gold, palladium, platinum, etc., but the disclosure is not limited thereto. The thickness of the first conductive layer 110 may range from 500 nanometers (nm) to 1500 nm.

Please refer to 1D. Within the range corresponding to the active area, a part of the first conductive layer 110 may constitute at least one gate G.

Figure 2A:
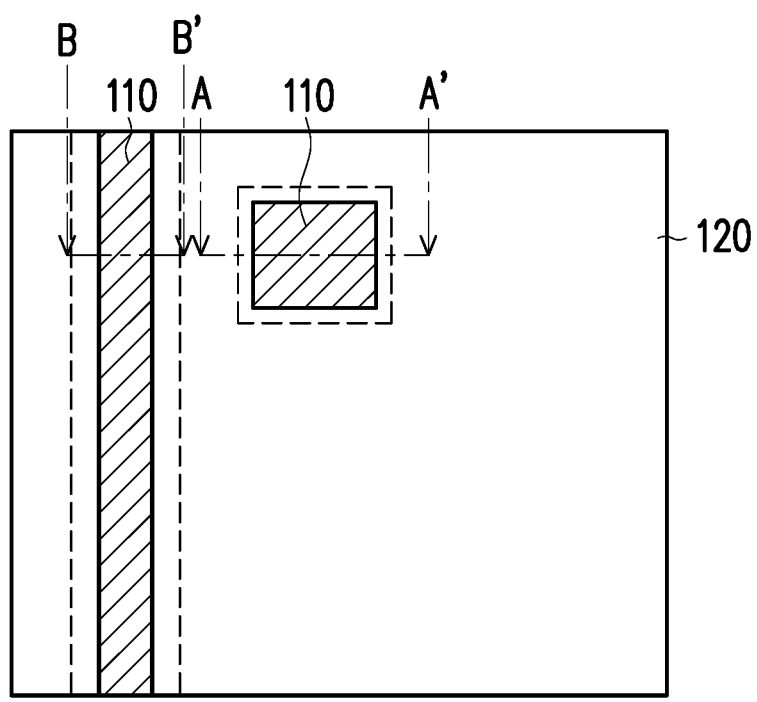
Figure 2B:
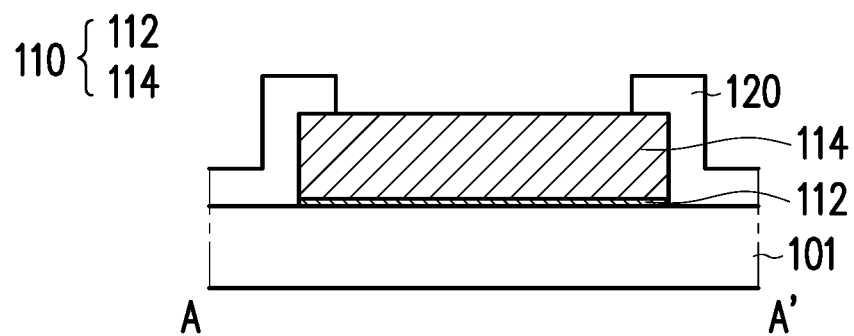
Figure 2C:
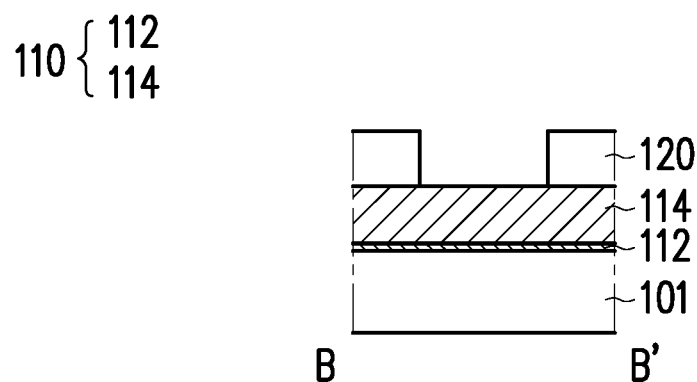
Figure 2D:
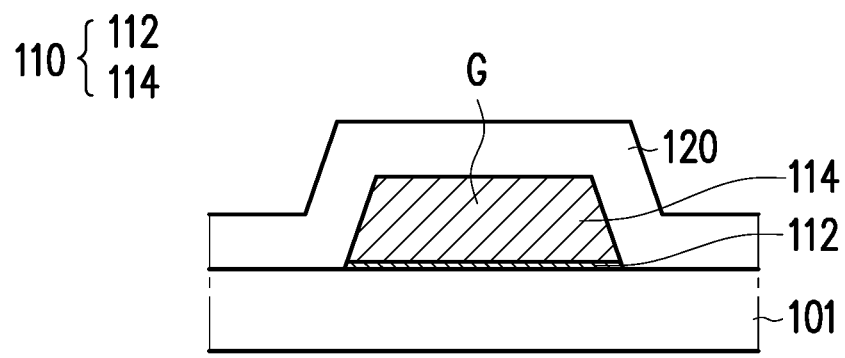

Please refer to 2A to 2D. A first insulating layer 120 is formed on the substrate surface 101a and covers the first conductive layer 110. For example, in FIG. 2B and FIG. 2C, the first insulating layer 120 partially covers the first conductive layer 110, so that a part of the surface of the first conductive layer 110 is exposed. In FIG. 2D, the first insulating layer 120 completely covers the first conductive layer 110.

In an embodiment, the first insulating layer 120 or a part of the first insulating layer 120 (for example, the part shown in FIG. 2D) may be referred to as a gate insulating (GI) layer, but the disclosure is not limited thereto.

Please refer to FIG. 3A to FIG. 3D. A second conductive layer 140 is formed on the first insulating layer 120. The second conductive layer 140 includes a first sputtering layer 142, a second sputtering layer 144, and a third sputtering layer 146 stacked sequentially, wherein the second sputtering layer 144 is located between the first sputtering layer 142 and the third sputtering layer 146. The first sputtering layer 142 includes a first metal element and a second metal element (for example, an alloy of the first metal element and the second metal element). The third sputtering layer 146 includes the first metal element and a third metal element (for example, an alloy of the first metal element and the third metal element). The second sputtering layer 144 includes a first metal element, but does not include the second metal element or the third metal element. The third metal element is different from the first metal element. The third metal element is, for example, nickel, iron, indium, antimony, bismuth, silver, gold, palladium, platinum, etc., but the disclosure is not limited thereto. The disclosure does not limit the third metal element and the second metal element to be the same or different. The thickness of the second conductive layer 140 ranges from 500 nm to 1500 nm.

Since the first sputtering layer 142 directly contacts the first insulating layer 120, and the first sputtering layer 142 includes the first metal element and the second metal element and/or the alloy of the first metal element and the second metal element, the adhesive force between the second conductive layer 140 and the first insulating layer may be improved to reduce the peeling of the second conductive layer 140 from the first insulating layer 120.

Figure 3A:
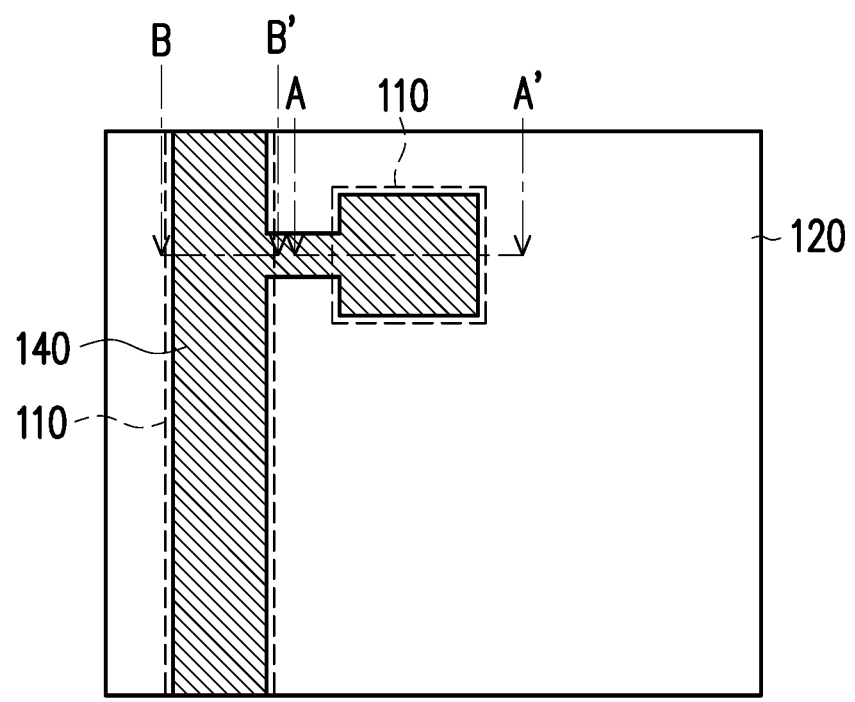
Figure 3B:
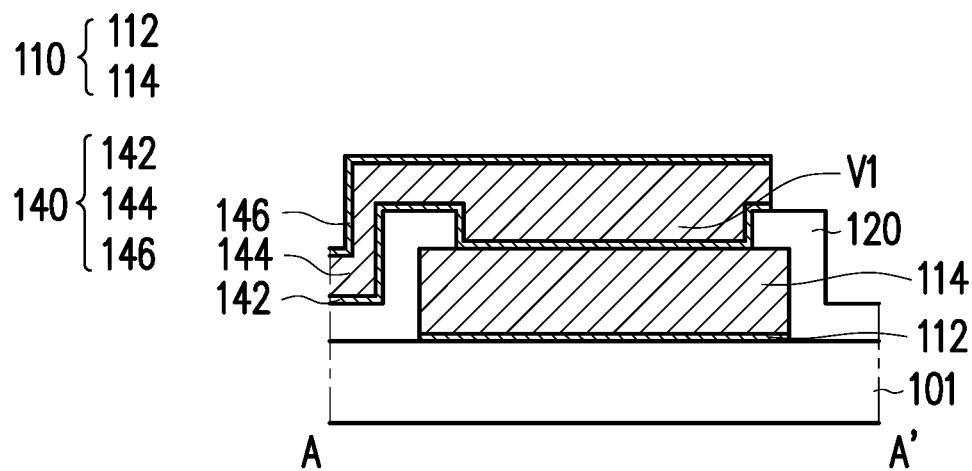
Figure 3C:
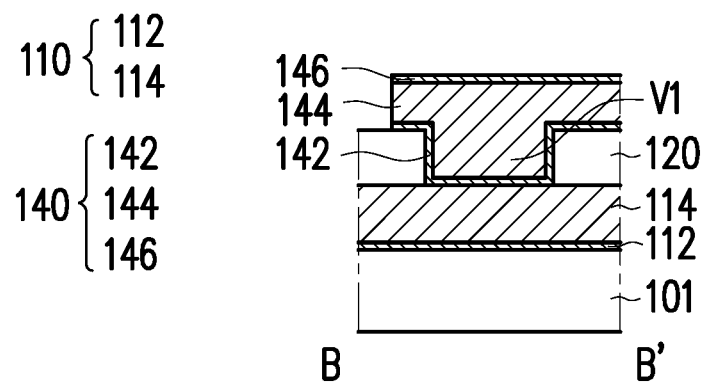

In FIG. 3B and FIG. 3C, a part of the second conductive layer 140 is embedded in the first insulating layer 120 and directly contacts a part of the first conductive layer 110 to constitute a conducting structure V1. By the corresponding conducting structure V1, a part of the first conductive layer 110 and a part of the second conductive layer 140 may be electrically connected. In other words, within the range corresponding to the inactive area, a part of the second conductive layer 140 is embedded in the first insulating layer 120 to constitute the conducting structure V1 electrically connected to a part of the first conductive layer 110.

Figure 3D:
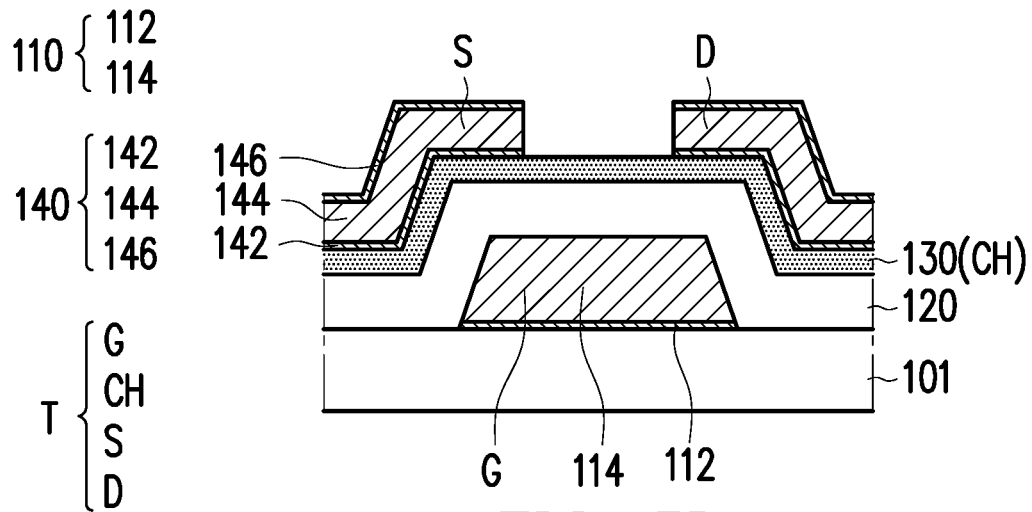

Please refer to FIG. 3D. Within the range corresponding to the active area, a part of the second conductive layer 140 may constitute at least one source S and at least one drain D, and the source S and the drain D are separated from each other. Before forming the second conductive layer 140 on the first insulating layer 120, a semiconductor layer 130 may be first formed on the first insulating layer 120, and a part of the semiconductor layer 130 may constitute at least one channel CH. The gate G, the channel CH, the source S, and the drain D may constitute an active element T, that is, at least part of the first conductive layer 110, a part of the semiconductor layer 130, and a part of the second conductive layer 140 may constitute the active element T.

In the embodiment, the active element T may be a bottom gate thin film transistor (TFT), but the disclosure is not limited thereto. In an embodiment not shown, a part of the first conductive layer 110, a part of the semiconductor layer 130, and a part of the second conductive layer 140 may constitute other types of active elements (for example, top gate TFTs), but not limited thereto. In an embodiment not shown, a part of the first conductive layer 110 and a part of the second conductive layer 140 may constitute other types of elements (for example, capacitors or other suitable passive elements).

Please refer to FIG. 4A to FIG. 4D. A second insulating layer 150 is formed on the second conductive layer 140. The second insulating layer 150 covers the second conductive layer 140. Within the range corresponding to the inactive area, the second insulating layer 150 has a first opening OP1 (please refer to FIG. 4B) to expose the surface of the second conductive layer 140. The second conductive layer 140 exposed by the first opening OP1 may be used as a connection pad 140a for connecting to other elements. For example, the first opening OP1 exposes the surface of the third sputtering layer 146 of the second conductive layer 140. In an embodiment, since the second sputtering layer 144 of the second conductive layer 140 is protected by the third sputtering layer 146, the possibility of oxidation or damping of the second sputtering layer 144 may be reduced.

After the manufacturing process, the manufacturing of the array substrate 100 may be substantially completed. In addition, the array substrate 100 may be a part of an electronic device 10A.

Please refer to FIG. 4A to FIG. 4D. The electronic device 10A includes the array substrate 100. The array substrate 100 includes the substrate 101, the first conductive layer 110, the first insulating layer 120, the second conductive layer 140, and the second insulating layer 150. The substrate 101 has the substrate surface 101a, which includes the active area and the inactive area. The first conductive layer 110 is located on the substrate surface 101a, the first insulating layer 120 is located on the first conductive layer 110, the second conductive layer 140 is located on the first insulating layer 120, and the second insulating layer 150 is located on the second conductive layer 140. The second conductive layer 140 includes the first sputtering layer 142, the second sputtering layer 144, and the third sputtering layer 146 stacked sequentially. The second sputtering layer 144 is located between the first sputtering layer 142 and the third sputtering layer 146. The first sputtering layer 142 includes the first metal element and the second metal element (for example, the alloy of the first metal element and the second metal element). The third sputtering layer 146 includes the first metal element and the third metal element (for example, the alloy of the first metal element and the third metal element). The second sputtering layer 144 includes the first metal element, but does not include the second metal element or the third metal element. The first metal element is, for example, copper, but the disclosure is not limited thereto. The second metal element or the third metal element is, for example, nickel, iron, indium, antimony, bismuth, silver, gold, palladium, platinum, etc., but the disclosure is not limited thereto. The thickness of the first conductive layer 110 or the thickness of the second conductive layer 140 ranges from 500 nm to 1500 nm.

The first sputtering layer 142 includes the first metal element and the second metal element (for example, the alloy of the first metal element and the second metal element), and the first sputtering layer 142 directly contacts the first insulating layer 120. In this way, the adhesive force between the second conductive layer 140 and the first insulating layer 120 may be improved to reduce the peeling of the second conductive layer 140 from the first insulating layer 120.

Figure 4A:
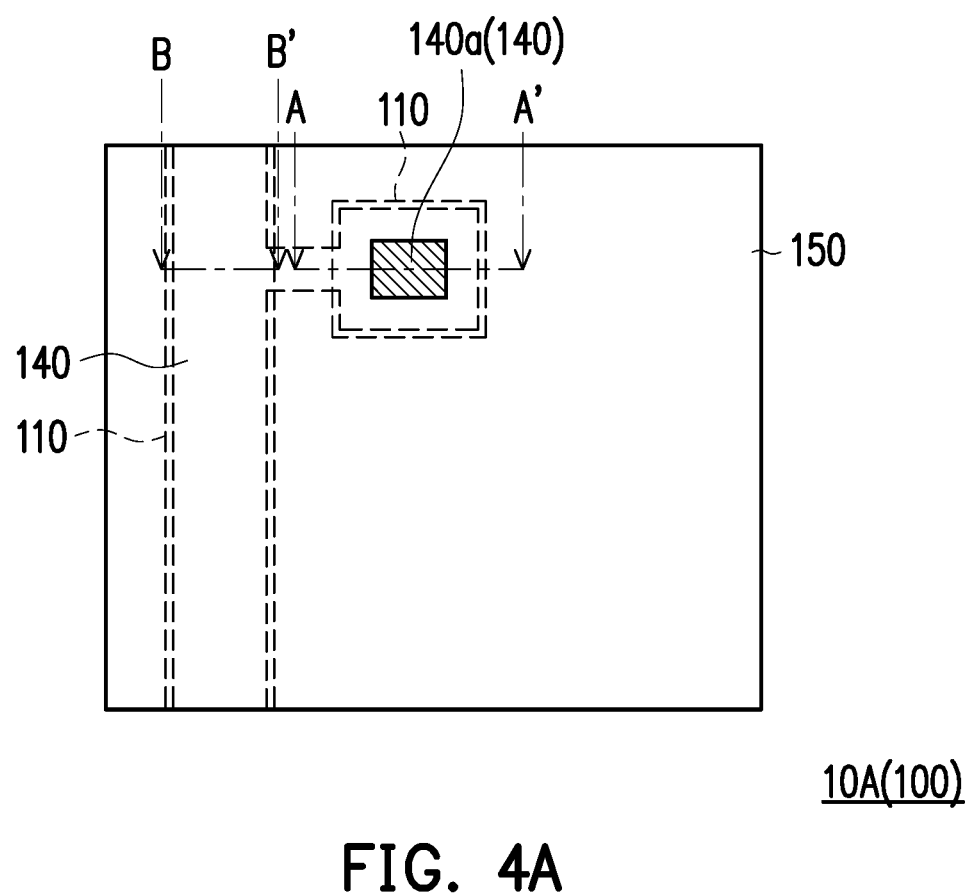
Figure 4B:
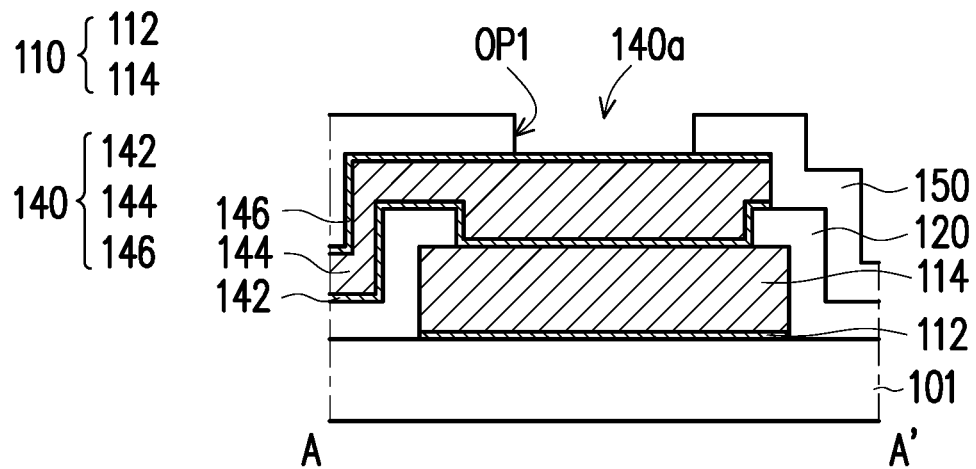
Figure 4C:
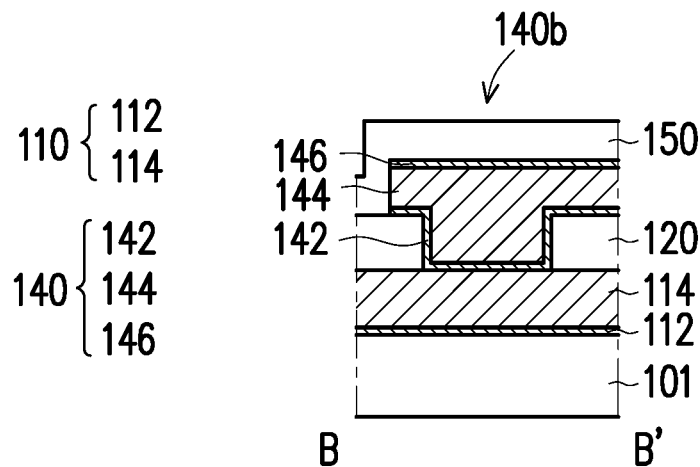

Within the range corresponding to the inactive area, the second insulating layer 150 has the first opening OP1 (please refer to FIG. 4B) to expose the surface of the second conductive layer 140, and the exposed second conductive layer 140 forms the connection pad 140a for connecting to other elements. In addition, as shown in FIG. 4C, a part of the second conductive layer 140 may be used as a wiring 140b for transmitting a signal.

Figure 4D:
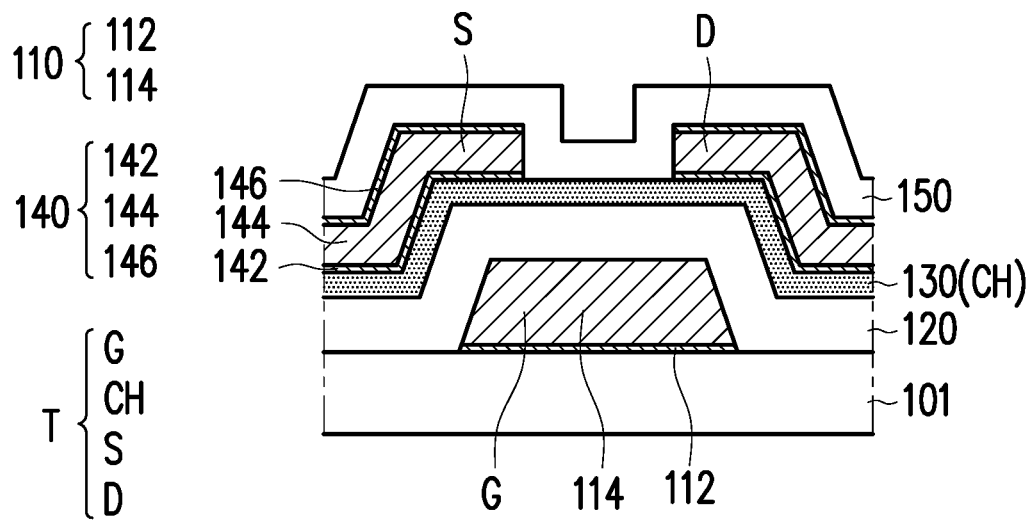

Within the range corresponding to the active area, the array substrate 100 may further include the semiconductor layer 130 (please refer to FIG. 4D). The semiconductor layer 130 is located between the first insulating layer 120 and the second conductive layer 140. A part of the first conductive layer 110, a part of the semiconductor layer 130, and a part of the second conductive layer 140 may constitute the active element T.

From another perspective, the array substrate 100 may include the connection pad 140a, the wiring 140b, and the active element T. It should be understood that the patterns, numbers, or positions of the connection pad 140a, the wiring 140b, and the active element T of the array substrate 100 in FIG. 4A to FIG. 4D are merely illustrative and are not intended to limit the disclosure. The patterns, numbers, or positions of the connection pad 140a, the wiring 140b, and the active element T may be configured according to actual requirements.

Figure 5:
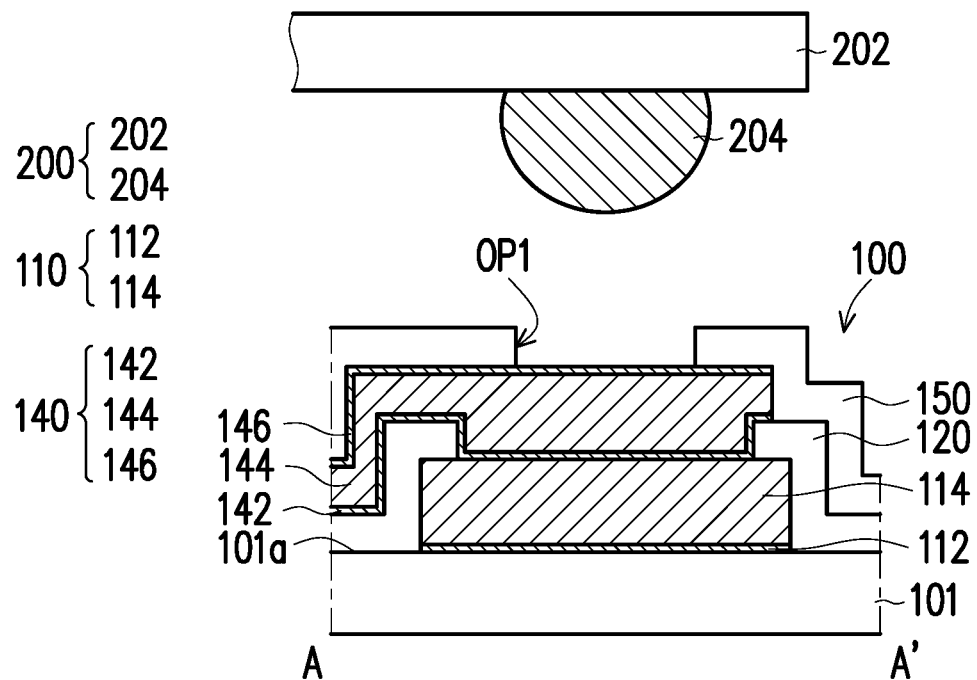
FIG. 5 to FIG. 6 are partial schematic views of part of a manufacturing process of an electronic device according to a second embodiment of the disclosure.
Figure 6:
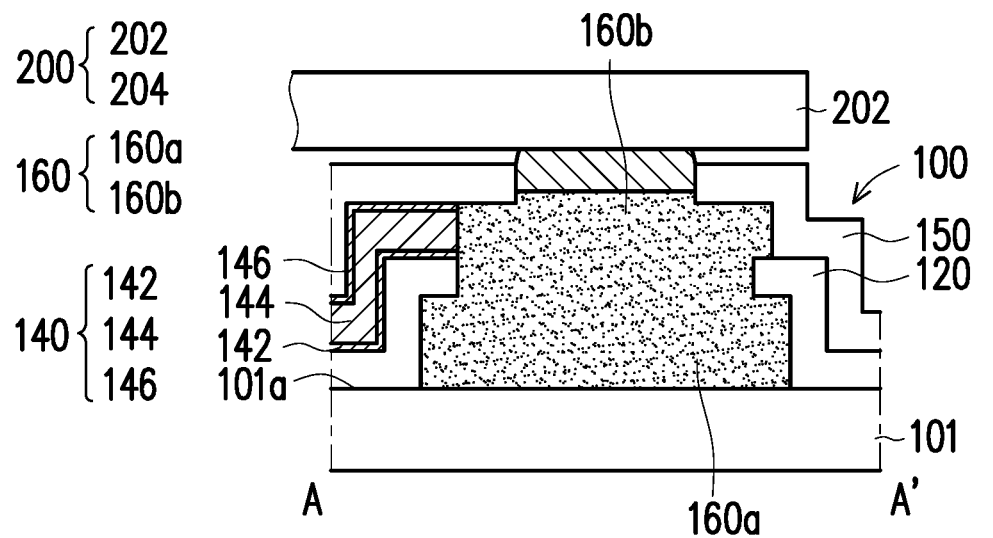

FIG. 5 to FIG. 6 are partial schematic views of part of a manufacturing process of an electronic device according to a second embodiment of the disclosure. An electronic device 10B of the embodiment is similar to the electronic device 10A of the first embodiment, and similar components are represented by the same reference numerals and have similar functions, materials, or forming manners, and the description is omitted. FIG. 5 to FIG. 6 may be cross-sectional schematic views in continuation of the manufacturing process of FIG. 4B.

Please refer to FIG. 5. An array substrate is provided.

In the embodiment, the array substrate adopted is the array substrate 100 of the foregoing embodiment. Therefore, the same or similar reference numerals or terms are used in the subsequent drawings or description, and the repeated content will not be repeated. In other words, in other places not shown in FIG. 5, the array substrate 100 may further include the connection pad 140a, the wiring 140b, or the active element T (as shown in FIG. 4A to FIG. 4D), but the disclosure is not limited thereto.

In an embodiment not shown, the array substrate used may be an array substrate similar to the array substrate 100.

Please continue to refer to FIG. 5. An electronic element 200 is provided. The electronic element 200 includes an element body 202 and a conductive terminal 204 configured on the element body 202.

The element body 202 may be, for example, a light emitting diode (LED) or other suitable elements, and the disclosure is not limited thereto.

The conductive terminal 204 is, for example, a solder ball, but the disclosure is not limited thereto. The conductive terminal 204 includes a fourth metal element. The fourth metal element may be different from the first metal element, the second metal element, and/or the third metal element. For example, the fourth metal element may be tin, but the disclosure is not limited thereto.

Please refer to FIG. 6. The array substrate 100 and the electronic element 200 are made to be in contact. Then, at least part of the second conductive layer 140 in the array substrate 100 and at least part of the conductive terminal 204 in the electronic element 200 form a conductive connection structure 160.

For example, at least part of the conductive terminal 204 in the electronic element 200 may be in direct contact with a part of the second conductive layer 140 through, for example, the first opening OP1 of the array substrate 100. Then, after a part of the conductive terminal 204 and a part of the second conductive layer 140 are in contact, at least a heating step may be performed to form the conductive connection structure 160.

In an embodiment, the conductive connection structure 160 may be an intermetallic compound (IMC). For example, the conductive connection structure 160 may be an intermetallic compound including at least the first metal element and the fourth metal element, but the disclosure is not limited thereto. It is worth noting that in FIG. 6, the shape or range of the conductive connection structure 160 may be schematically shown, which may change correspondingly according to manufacturing parameters (for example, heating time and/or temperature, type of metal element used, pressure applied when the array substrate 100 and the electronic element 200 are in contact, etc.). In addition, the boundary of the conductive connection structure 160 (for example, the contact surface between the conductive connection structure 160 and the conductive terminal 204, the second conductive layer 140, and/or the first conductive layer 110) may be irregular or non-planar.

In the embodiment, the conductive connection structure 160 may also be in direct contact with a part of the first conductive layer 110. In other words, after a part of the conductive terminal 204 and a part of the second conductive layer 140 are in contact, at least a heating step may be performed, so that a part of the conductive terminal 204, a part of the first conductive layer 110, and a part of the second conductive layer 140 form the conductive connection structure 160.

In the embodiment, the second conductive layer 140 includes the first sputtering layer 142, the second sputtering layer 144, and the third sputtering layer 146 stacked sequentially, and the first sputtering layer 142 includes the first metal element and the second metal element (for example, the alloy of the first metal element and the second metal element), the third sputtering layer 146 includes the first metal element and the third metal element (for example, the alloy of the first metal element and the second metal element), and the second sputtering layer 144 includes the first metal element, but does not include the second metal element or the third metal element. Therefore, a part of the first conductive layer 110 and a part of the second conductive layer 140 may more easily form the intermetallic compound with the conductive terminal 204 of the electronic element 200. In this way, the bonding strength between the array substrate 100 and the electronic element 200 may be improved. In addition, since the first sputtering layer 142 directly contacts the first insulating layer 120, the adhesive force between the second conductive layer 140 and the first insulating layer 120 may be improved to reduce the peeling of the second conductive layer 140 from the first insulating layer 120.

In an embodiment, the fourth metal element includes tin, and the first metal element, the second metal element, and/or the third metal element do not include molybdenum. It is difficult for tin and molybdenum to form the intermetallic compound. If it is difficult to form the intermetallic compound, the bonding strength may decrease.

In the embodiment, the conductive terminal 204 configured on the element body 202 may be different in size or morphology before or after the array substrate 100 and the electronic element 200 are in contact; and/or, the conductive layer (for example, the second conductive layer 140 or the first conductive layer 110) of the array substrate 100 may be different in size or morphology before or after the array substrate 100 and the electronic element 200 are in contact. For example, after the array substrate 100 and the electronic element 200 are in contact, a part of the conductive layer of the array substrate 100 may form the conductive connection structure 160 with a part of the conductive terminal 204. The material of the conductive connection structure 160 is slightly different from the material of the conductive layer (for example, the material of the conductive connection structure 160 includes elements that are not included in the conductive layer), and the material of the conductive connection structure 160 is slightly different from the material of the conductive terminal 204 (for example, the material of the conductive connection structure 160 includes elements that are not included in the conductive terminal 204).

However, for ease of presentation, elements or components before or after the array substrate 100 and the electronic element 200 are in contact are still described with the same names or reference numerals. Persons skilled in the art of the disclosure should be able to understand semantic statements similar to fuzzy logic and corresponding concept.

After the above manufacturing process, the manufacturing of the electronic device 10B of the embodiment may be substantially completed.

Please refer to FIG. 6, the electronic device 10B includes the array substrate 100, the electronic element 200, and the conductive connection structure 160.

In a direction perpendicular to the substrate surface 101a, the conductive connection structure 160 includes a first area 160a and a second area 160b. The first area 160a is closer to the substrate surface 101a than the second area 160b. In the first area 160a, the first metal element has a first ratio to the fourth metal element (for example, a relative molar number of the first metal element within a detection range or a derivative unit thereof/a relative molar number of the fourth metal element in the detection range or a derivative unit thereof; the same applies subsequently); and in the second area 160b, the first metal element has a second ratio to the fourth metal element, and the first ratio is greater than the second ratio. In an embodiment, the first ratio is, for example, 3/1, and the second ratio is, for example, 6/5, but the disclosure is not limited thereto. In an embodiment, the type or content of the elements may be directly or indirectly obtained by energy-dispersive X-ray spectroscopy (EDX/EDS) analysis, but the disclosure is not limited thereto.

In an embodiment, in the conductive connection structure 160, the ratio of the first metal element to the fourth metal element may gradually decrease from the first area 160a to the second area 160b.

Since the electronic device 10B has the conductive connection structure 160, the bonding between the array substrate 100 and the electronic element 200 may be strengthened, so that the yield rate of the electronic device 10B is improved.

It should be understood that FIG. 6 of the disclosure only schematically shows the cross-sectional view of a part of the electronic device 10B. Although FIG. 6 does not show the first conductive layer 110, the electronic device 10B may include the first conductive layer 110 in other places not shown and may also include the structures of the connection pad 140a, the wiring 140b, or the active element T, and the disclosure is not limited thereto.

In summary, the electronic device of the disclosure has the array substrate. The second conductive layer of the array substrate includes the first sputtering layer, the second sputtering layer, and the third sputtering layer stacked sequentially. Since the first sputtering layer directly contacts the first insulating layer, and the first sputtering layer includes the first metal element and the second metal element, and/or the alloy of the first metal element and the second metal element, the adhesive force between the second conductive layer and the insulating layer can be strengthened to prevent peeling from the insulating layer, so as to have a better yield. Since the third sputtering layer is located on the second sputtering layer, the second sputtering layer is protected by the third sputtering layer, which can solve the issue of easy oxidation on the surface of the second sputtering layer. In addition, in the manufacturing method of the electronic device of the disclosure, the conductive connection structure formed by the array substrate and the electronic element being in contact can have a good bonding strength, so that the yield of the electronic device is improved.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:

1. An electronic device, comprising:
   an array substrate, comprising:
   a substrate, having a substrate surface;
   a first conductive layer, located on the substrate surface;
   a first insulating layer, located on the first conductive layer;
   a second conductive layer, located on the first insulating layer and comprising a first sputtering layer, a second sputtering layer, and a third sputtering layer; and
   a second insulating layer, located on the second conductive layer, wherein:
   the second sputtering layer is located between the first sputtering layer and the third sputtering layer;
   the second sputtering layer comprises a first metal element;
   the first sputtering layer comprises the first metal element and a second metal element; and
   the third sputtering layer comprises the first metal element and a third metal element,
   wherein the array substrate further comprises a semiconductor layer, and the substrate comprises an active area and an inactive area, wherein:
   within a range corresponding to the inactive area, at least part of the second conductive layer constitutes a connection pad;
   within a range corresponding to the active area, at least part of the first conductive layer, a part of the semiconductor layer, and a part of the second conductive layer constitute an active element; and
   within the range corresponding to the inactive area, a part of the second conductive layer is embedded in the first insulating layer to constitute a conducting structure electrically connected to a part of the first conductive layer.

2. The electronic device according to claim 1, wherein:
   the first sputtering layer comprises an alloy of the first metal element and the second metal element;
   the second sputtering layer does not comprise the second metal element or the third metal element; and/or
   the third sputtering layer comprises an alloy of the first metal element and the third metal element.

3. The electronic device according to claim 1, wherein a thickness of the first conductive layer or a thickness of the second conductive layer ranges from 500 nm to 1500 nm.

4. The electronic device according to claim 1, further comprising:
   an electronic element, comprising an element body and a conductive terminal configured on the element body; and
   a conductive connection structure, directly connecting the conductive terminal and the second conductive layer.

5. The electronic device according to claim 4, wherein the conductive connection structure further directly connects the first conductive layer.

6. The electronic device according to claim 4, wherein in a direction perpendicular to the substrate surface, the conductive connection structure comprises a first area and a second area, wherein:
   the first area is closer to the substrate surface than the second area;
   the conductive terminal comprises a fourth metal element;
   in the first area, the first metal element has a first ratio to the fourth metal element;
   in the second area, the first metal element has a second ratio to the fourth metal element; and
   the first ratio is greater than the second ratio.

7. The electronic device according to claim 6, wherein a ratio of the first metal element to the fourth metal element gradually decreases from the first area to the second area.

* * * * *